United States Patent
Si et al.

(10) Patent No.: US 11,764,315 B2
(45) Date of Patent: Sep. 19, 2023

(54) SOLAR CELL SEPARATION WITH EDGE COATING

(71) Applicant: SunPower Corporation, San Jose, CA (US)

(72) Inventors: Jianfang Si, Kunshan (CN); Yafu Lin, San Jose, CA (US); Nicholas Eli Berry, Portland, OR (US)

(73) Assignee: MAXEON SOLAR PTE. LTD., Singapore (SG)

( * ) Notice: Subject to any disclaimer, the term of this patent is extended or adjusted under 35 U.S.C. 154(b) by 0 days.

(21) Appl. No.: 17/474,772

(22) Filed: Sep. 14, 2021

(65) Prior Publication Data

US 2022/0085223 A1 Mar. 17, 2022

Related U.S. Application Data

(60) Provisional application No. 63/079,021, filed on Sep. 16, 2020.

(51) Int. Cl.
*H01L 31/0216* (2014.01)
*H01L 31/18* (2006.01)

(52) U.S. Cl.
CPC ...... *H01L 31/02167* (2013.01); *H01L 31/186* (2013.01); *H01L 31/1824* (2013.01)

(58) Field of Classification Search
CPC ............... H01L 31/1824; H01L 31/183; H01L 31/02167; H01L 31/186
See application file for complete search history.

(56) References Cited

U.S. PATENT DOCUMENTS

| 5,164,019 | A | * | 11/1992 | Sinton | H01L 31/0475 225/2 |
| 6,084,175 | A | * | 7/2000 | Perry | H01L 31/02363 257/466 |
| 10,427,968 | B2 | | 10/2019 | Dai et al. | |
| 2008/0047599 | A1 | * | 2/2008 | Buller | H01L 31/0475 257/E27.125 |
| 2008/0160265 | A1 | * | 7/2008 | Hieslmair | H01L 21/02601 427/78 |
| 2008/0241356 | A1 | * | 10/2008 | Fu | H01L 31/0465 427/74 |

(Continued)

FOREIGN PATENT DOCUMENTS

| CN | 103395976 A | 11/2013 |
| CN | 107628757 A | 1/2018 |

(Continued)

OTHER PUBLICATIONS

Healing of micro-cracks in optical glass using a pulsed laser, Abstract [retrieved on Dec. 8, 2020], 3 sheets, retrieved from the internet: https://keio.pure.elsevier.com/en/publications/healing-of-micro-cracks-in-optical-glass-using-a-pulsed-laser.

*Primary Examiner* — Sadie White
(74) *Attorney, Agent, or Firm* — GRASSO PLLC

(57) ABSTRACT

A groove is cut along a line between adjacent solar cells of a wafer. A coating powder is processed to form a coating layer on the surface of the groove. The solar cells are thereafter physically separated from each other along the groove, with the coating layer serving as an edge coat. The solar cells are electrically connected in series and packaged in a solar module.

20 Claims, 10 Drawing Sheets

(56) References Cited

U.S. PATENT DOCUMENTS

| | | | |
|---|---|---|---|
| 2011/0124147 A1* | 5/2011 | Mayerhofer | B23K 26/40 |
| | | | 257/E21.599 |
| 2011/0171757 A1* | 7/2011 | Yamamuro | B23K 26/364 |
| | | | 257/E31.11 |
| 2013/0045559 A1* | 2/2013 | Oka | C23C 24/10 |
| | | | 257/E31.119 |
| 2014/0057413 A1* | 2/2014 | Yang | B32B 37/28 |
| | | | 438/460 |
| 2014/0179056 A1* | 6/2014 | Morse | H01L 31/182 |
| | | | 438/97 |
| 2015/0090314 A1* | 4/2015 | Yang | H01L 31/0504 |
| | | | 438/66 |
| 2016/0133779 A1* | 5/2016 | Adachi | H01L 31/022425 |
| | | | 438/66 |
| 2019/0319144 A1 | 10/2019 | Lin et al. | |
| 2020/0411712 A1* | 12/2020 | Galiazzo | H01L 31/0504 |

FOREIGN PATENT DOCUMENTS

| | | | |
|---|---|---|---|
| JP | 2014-37334 A | 2/2014 | |
| WO | 2015/183827 A2 | 12/2015 | |
| WO | WO-2019170240 A1 * | 9/2019 | H01L 31/186 |

* cited by examiner

SOLAR CELL SEPARATION WITH EDGE COATING

CROSS-REFERENCE TO RELATED APPLICATION

This application claims the benefit of U.S. Provisional Application No. 63/079,021, filed on Sep. 16, 2020, which is incorporated herein by reference in its entirety.

TECHNICAL FIELD

Embodiments of the subject matter described herein relate generally to solar cells. More particularly, embodiments of the subject matter relate to separation of solar cells from a wafer.

BACKGROUND

Solar cells are well known devices for converting solar radiation to electrical energy. A solar cell has a front side that faces the Sun during normal operation to collect solar radiation and a backside opposite the front side. Solar radiation received by the solar cell creates electrical charges that may be harnessed to power an external electrical circuit, such as a load.

A plurality of solar cells may be fabricated on the same wafer. The wafer may have a rectangular, pseudo-square, or some other shape. At some point in the fabrication process, the solar cells are separated from the wafer. For example, a laser beam may be used to cut individual solar cells from the wafer.

BRIEF SUMMARY

In one embodiment, a method of fabricating solar cells includes using a first laser beam to cut a groove between a first solar cell and a second solar cell that are adjacent on a wafer. A coating powder is deposited in the groove. The coating powder may be mixed in the form of a sol-gel, ink, or paste to facilitate use during the fabrication process. Using a second laser beam, the coating powder is melted in the groove to form a coating layer on a surface of the groove. After melting the coating powder, the first solar cell is physically separated from the second solar cell along the groove.

In another embodiment, a solar module comprises a first solar cell and a second solar cell that are electrically connected in series. An edge of the second solar cell spans across a light-receiving surface of the first solar cell, and an edge of the first solar cell spans across a back surface of the second solar cell. A coating layer that provides passivation is formed on each of the aforementioned edges of the first and second solar cells. An encapsulant encapsulates at least the first and second solar cells.

In yet another embodiment, a method of fabricating solar cells includes forming a groove between a first solar cell and a second cell that are formed on a wafer. A coating material is deposited in the groove. The coating material is melted in the groove to form a coating layer on a surface of the groove. After melting the coating material, the first solar cell is physically separated from the second solar cell.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
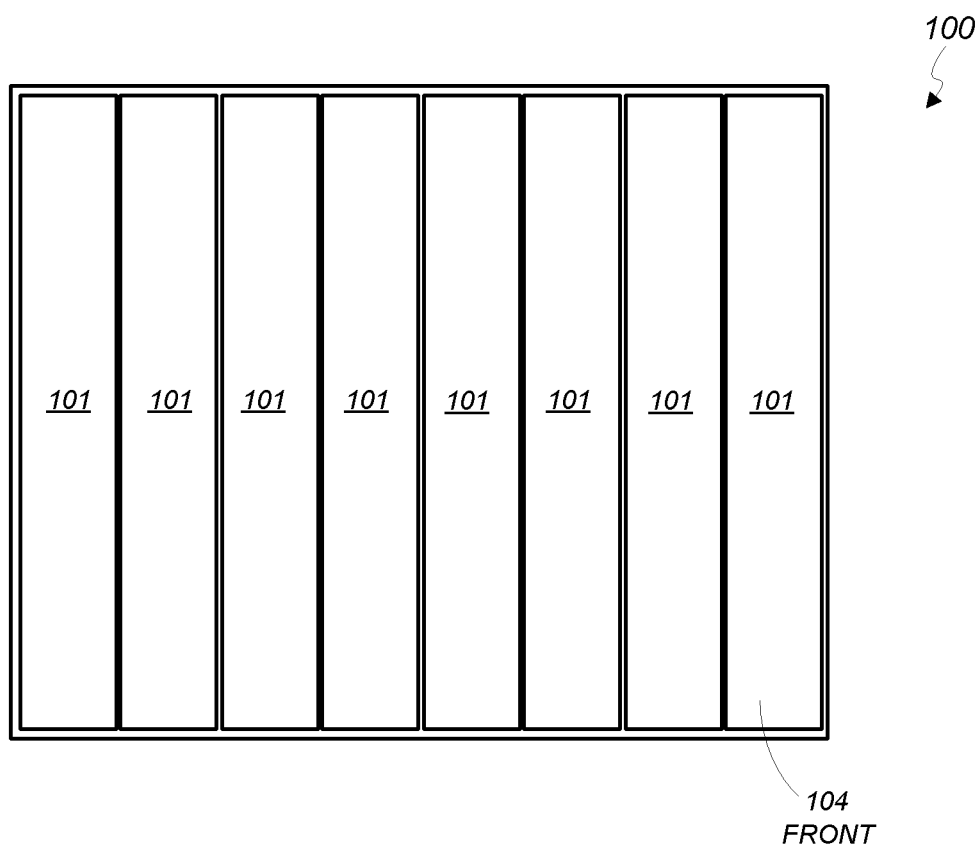
FIG. 1 shows a plan view of a front side of a wafer in accordance with an embodiment of the present invention.

FIG. 1 shows a plan view of a front (i.e., light-receiving) side 104 of a wafer 100 in accordance with an embodiment of the present invention. In the example of FIG. 1, a plurality of strips of solar cells 101 are fabricated on the wafer 100. Eight solar cells 101 are shown in FIG. 1 for illustration purposes. As can be appreciated, the number of solar cells on a wafer will depend on the size of the wafer, the particulars of the solar cells, and/or other factors. The wafer 100 is illustrated as having a rectangular shape, but may also have a pseudo-square, square, or other shape.

Figure 2:
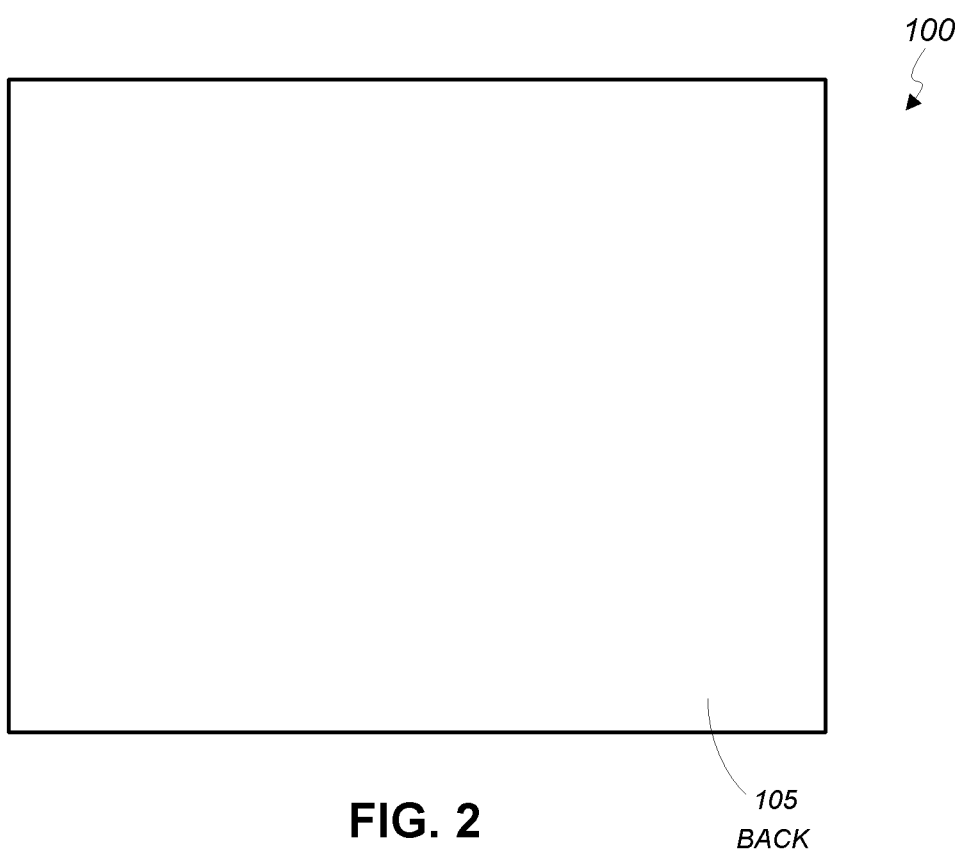
FIG. 2 shows a plan view of a backside of the wafer of FIG. 1 in accordance with an embodiment of the present invention.

FIG. 2 shows a plan view of a backside 105 of the wafer 100 in accordance with an embodiment of the present invention. The backside 105 is opposite the front side 104.

FIGS. 3-9 show cross-sectional views that illustrate a method of separating solar cells from a wafer in accordance with an embodiment of the present invention. In the example of FIGS. 3-9, a solar cell 101-1 and a solar cell 101-2 are adjacent solar cells 101 on the wafer 100.

In one embodiment, a laser machine (not shown) is employed to generate the laser beams described below. The laser machine may comprise a commercially-available laser wafer dicing machine, for example. The wafer 100 may be processed in situ, i.e., in one loading, in the laser machine to separate the solar cells 101 from the wafer 100.

Figure 3:
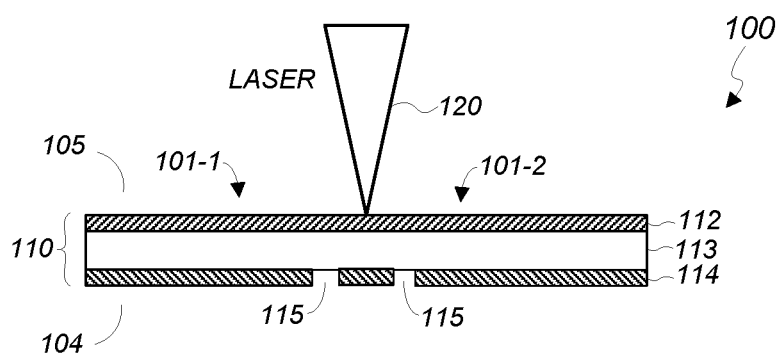
FIGS. 3-9 show cross-sectional views that illustrate a method of separating solar cells from a wafer in accordance with an embodiment of the present invention.

Referring first to FIG. 3, the wafer 100 provides a substrate 110 for the solar cells 101. In one embodiment, the substrate 110 comprises monocrystalline silicon. Formed within the substrate 110 are a P-type back surface field (BSF) layer 112, a P-type layer 113, and an N-type emitter layer 114. The doping type and functions of the layers may vary depending on the particulars of the solar cells 101. Metal contacts and other layers formed on or within the substrate 110 are not shown for clarity of illustration. As can be appreciated, in some embodiments, the layer 113 may be an N-type with corresponding changes to the polarity/doping of the other layers.

In the example of FIG. 3, trenches 115 are formed to cut through the emitter layer 114 between adjacent solar cells 101. The trenches 115 may be formed by laser processing or masking and wet etching techniques, for example. The trenches 115 facilitate separation of the solar cells 101 and isolate damaged cleaved edges away from the solar cells.

Figure 4:
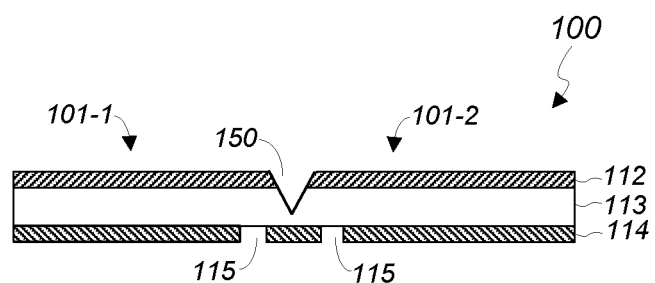

In the example of FIG. 3, a laser beam 120 is scanned on the backside 105 of the wafer 100 to form a groove 150 between the solar cells 101-1 and 101-2. Referring to FIG. 4, one or more characteristics (e.g., power, wavelength, speed, etc.) of the laser beam 120 are set such that the groove 150 does not go all the way through the layer 113. In one embodiment, the groove 150 is all the way through the layer 112 and into the layer 113 but is not deep enough to gouge the emitter layer 114. For example, the laser beam 120 may have a 1064 nm wavelength, 180 W power, and approximately 8-10 m/s speed, and may cut the wafer approximately 6-8 times. As can be appreciated, the characteristics of the laser beam 120 may vary depending on the particulars of the solar cells 101.

Figure 5:
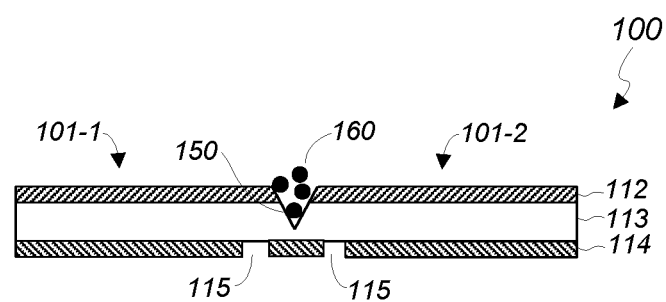

In the example of FIG. 5, a coating powder 160 is deposited in the groove 150. The coating powder 160 may be deposited by spraying, by screen printing, or by other suitable deposition process depending on the composition and form of the coating powder 160. For example, the coating powder 160 may be converted to a paste, which is then deposited in the groove 150 by jetting. Generally, the coating powder 160 may be mixed in the form of a sol-gel, ink, or paste to facilitate use during the fabrication process.

As will be more apparent below, the coating powder 160 is subsequently melted to form a coat on edges of separated solar cells. The coating powder 160 may be selected such that the resulting edge coat fills micro-cracks to increase tensile strength on edges of individual solar cells. The coating powder 160 may comprise an alloy, alumina, silicon dioxide (SiO2), boric oxide (B2O3), boron nitride (BN), gallium oxide (Ga2O3), magnesium fluoride (MgF2), polymer, or other suitable material. A coating powder 160 comprising boron or aluminum provides an additional benefit of doping an edge when heated with higher-temperature laser beam, thereby providing surface passivation on the edge to decrease power loss. The coating powder 160 thus allows for forming a passivation layer on edges of the solar cells 101 as part of the separation process. The inventors have discovered that a coating powder 160 that has a particle size less than 10 micrometers is quite effective in increasing the tensile strength of an edge, and a doped coating powder 160 (e.g., with alumina) not only passivates dangling bonds of silicon surfaces but also serves as an electrical surface field that repels minority charge carrier electrons away from the edge.

Figure 6:
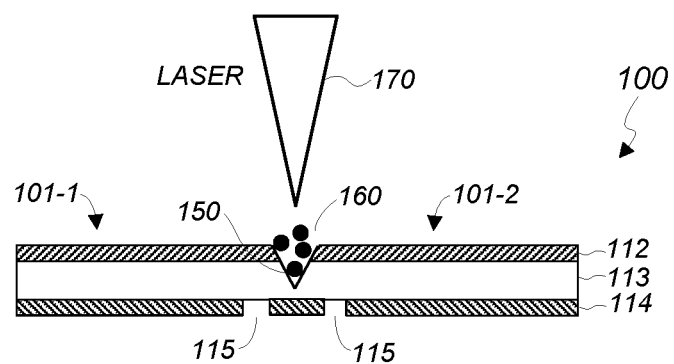
Figure 7:
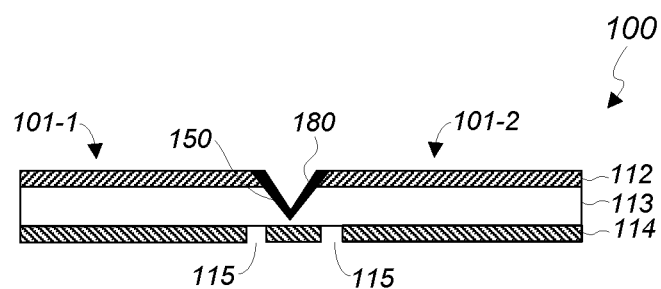

In the example of FIG. 6, a laser beam 170 melts the coating powder 160, which congeals into a coating layer 180 on the surface of the groove 150 as shown in FIG. 7. One or more characteristics of the laser beam 170 are set such that the laser beam 170 melts the coating powder 160. For example, the laser beam 170 may be set to a lower power level compared to the laser beam 120 so that the coating powder 160 is melted without further altering the structure of the solar cells 101. For example, the laser beam 170 may have a 1064 nm wavelength, 80 W power, and approximately 8-10 m/s speed, and may cut the wafer approximately 1-3 times. A washing step may thereafter be performed to clean off any remaining coating powder residue.

Figure 8:
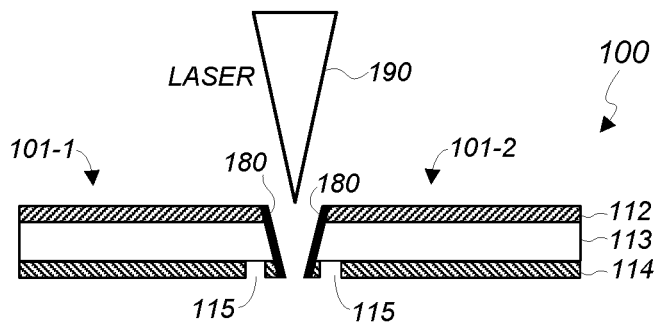

In the example of FIG. 8, a laser beam 190 is used to physically separate the solar cells 101-1 and 101-2 from each other. One or more characteristics of the laser beam 190 are set such that the laser beam 190 facilitates separation of the solar cell 101-1 from the solar cell 101-2. For example, the laser beam 190 may be configured similarly to the laser beam 120, with adjustments to cause the separation step as needed.

Instead of using the laser beam 190, the solar cells 101-1 and 102, from FIG. 7, may also be physically separated from each other along the groove 150 by mechanical force, because the groove 150 already cuts more than 50% of the wafer thickness. For example, the wafer 100 may be flexed against a curved surface to separate the solar cells 101-1 and 101-2 along the groove 150 as described in PCT International Publication No. WO 2015183827 A2. A scribe line on the groove 150 may or may not be needed depending on the condition of the surface of the groove 150. As can be appreciated, the solar cells 101-1 and 101-2 may also be separated using other suitable separation processes, including by Thermal Laser Separation (TLS).

Figure 9:
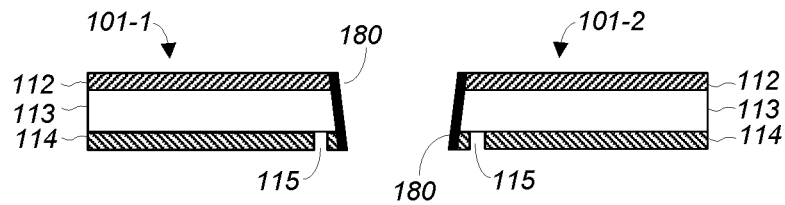

FIG. 9 shows the solar cells 101-1 and 101-2 after separation.

Figure 10:
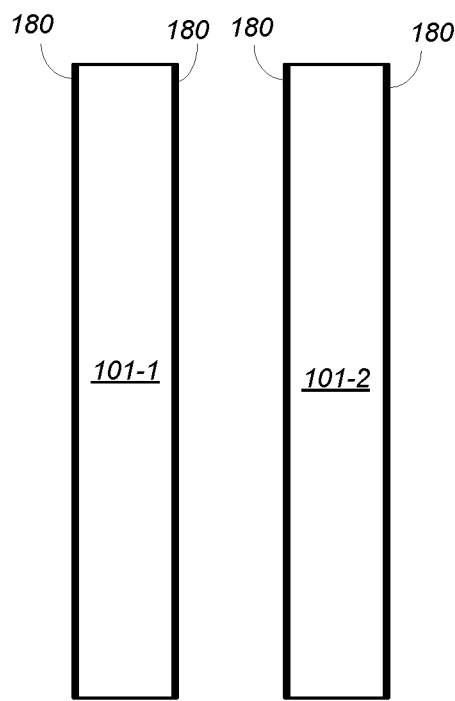
FIG. 10 shows a plan view of a front side of solar cells that have been separated from the wafer of FIG. 1 in accordance with an embodiment of the present invention.

FIG. 10 shows a plan view of a front side of the solar cells 101-1 and 101-2 in accordance with an embodiment of the present invention. In the example of FIG. 10, the edges of the solar cells 101-1 and 101-2 along the separation grooves have the coating layer 180 serving as an edge coat. FIG. 10 shows the solar cells 101-1 and 101-2 as individual solar cells that have been separated from other solar cells 101 of the wafer 100. The above-described process may be performed for each solar cell 101 of the wafer 100. As can be appreciated, an edge of a solar cell 101 does not necessarily have the coating layer 180 when a groove 150 has not been formed along the edge, as may be the case for side edges and edges that are on outermost ends of the wafer 100.

Figure 11:
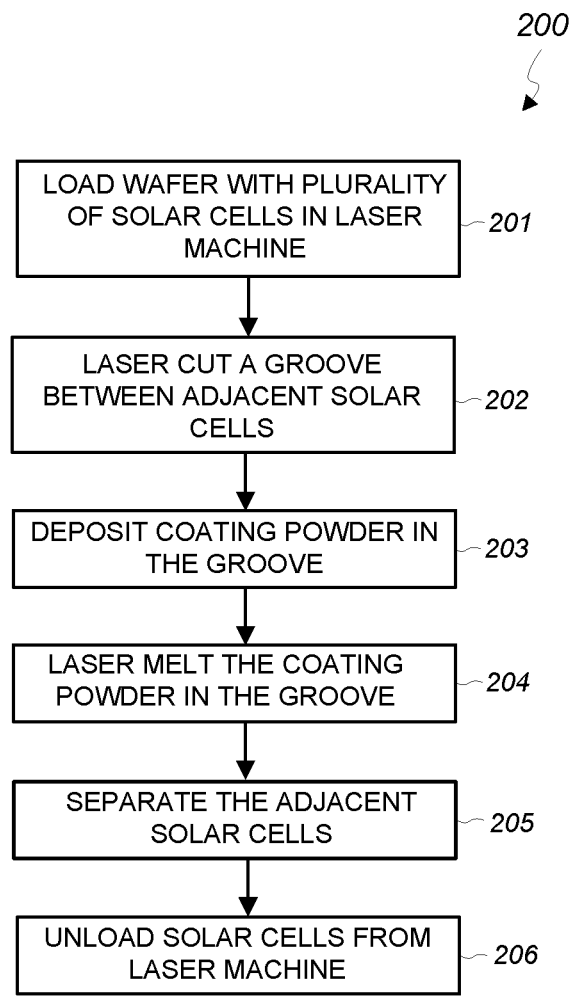
FIG. 11 shows a flow diagram of a method of separating solar cells from a wafer in accordance with an embodiment of the present invention.

FIG. 11 shows a flow diagram of a method 200 of separating solar cells from a wafer in accordance with an embodiment of the present invention. The method 200 may be performed as part of a solar cell fabrication process.

In the method 200, a wafer that has a plurality of solar cells is loaded into a laser machine (step 201). Using a first laser beam, a groove is cut along a line between adjacent solar cells of the plurality of solar cells (step 202). A coating powder is deposited in the groove (step 203). Using a second laser beam, the coating powder is melted to form a coating layer on a surface of the groove (step 204). The adjacent solar cells are thereafter physically separated from each other along the groove (step 205), with the coating layer serving as an edge coat. The above-described steps are performed to separate the plurality of solar cells from the wafer. Thereafter, the plurality of solar cells is unloaded from the laser machine (step 206).

Figure 12:
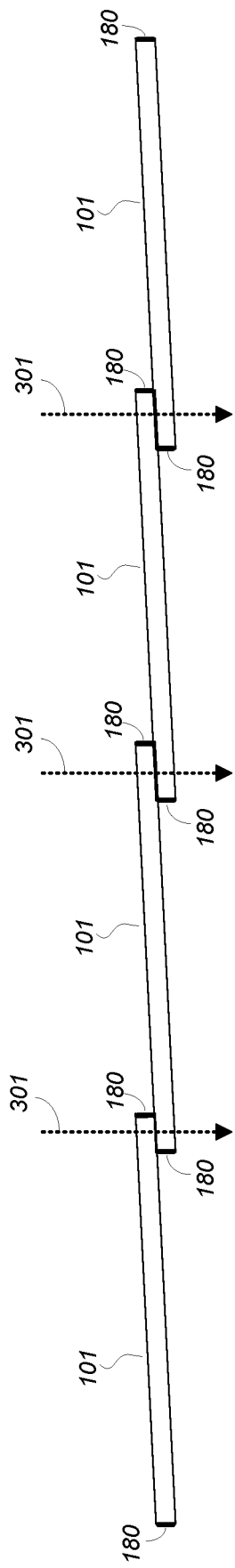
FIG. 12 is a side view of shingled solar cells in accordance with an embodiment of the present invention.

FIG. 12 is a side view of shingled solar cells 101 in accordance with an embodiment of the present invention. FIG. 12, shows the coating layers 180 on edges of the solar cells 101 where separation has been performed. Other structures of the solar cells 101 are not shown for clarity of illustration.

In one embodiment, the separated solar cells 101 are shingled to electrically connect the solar cells 101 in series to form a hypercell or a series-connected string of solar cells. Only four solar cells 101 are shown for illustration purposes. As shown in FIG. 12, the solar cells 101 are arranged to overlap at connection regions (see FIG. 12, 301) to form series-connected solar cells 101. The connection regions may include contact pads, electrically conductive adhesive (ECA) layers, holes, and/or other connection structures to electrically connect a P-type layer 113 (see FIG. 3) of a solar cell 101 to an N-type emitter layer 114 of an adjacent solar cell 101. The aforementioned PCT International Publication No. WO 2015183827 A2 also discloses a suitable shingling process that may be employed with embodiments of the present invention. It is to be noted, however, that the edge coat technique presented in this disclosure could also be used with non-overlapping half-cut or multi-cut cells that are interconnected with conductive photovoltaic ribbons or wires.

Figure 13:
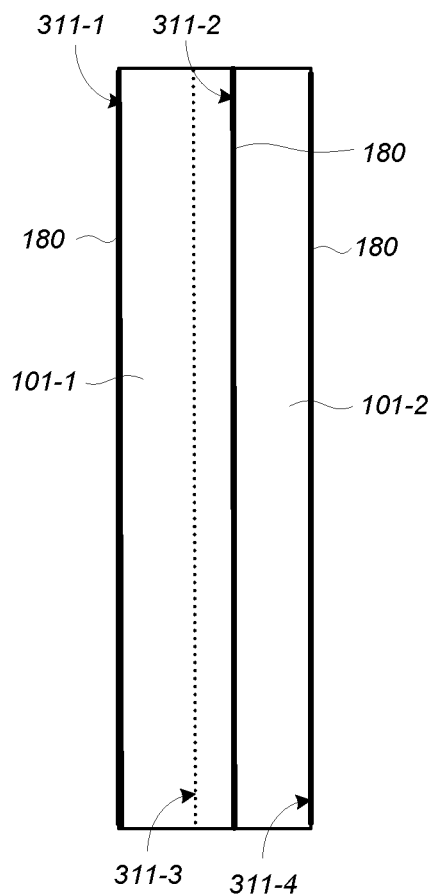
FIG. 13 is a plan view of shingled solar cells in accordance with an embodiment of the present invention.

In the example of FIG. 12, a coating layer 180 is on an edge of a solar cell 101 that spans across a surface of an adjacent solar cell 101. This is further illustrated in FIG. 13, which shows a plan view of a solar cell 101-1 and a solar cell 101-2 that have been shingled together. In the example of FIG. 13, the solar cell 101-1 has an edge 311-1 and an edge 311-2. Similarly, the solar cell 101-2 has an edge 311-3 (under the solar cell 101-1 as viewed) and an edge 311-4. Each of the edges 311-1, 311-2, 311-3, and 311-4 has a coating layer 180. The other edges (i.e., along the sides) of the solar cells 101-1 and 101-2 do not necessarily need to have a coating layer 180. Note that the edge 311-2 spans across a surface (e.g., back surface) of the solar cell 101-2, the edge 311-3 spans across a surface (e.g., light-receiving surface) of the solar cell 101-1, the edge 311-4 spans across a surface of a following adjacent solar cell 101 (not shown), etc.

FIGS. 14-17 show cross-sectional views that illustrate a method of fabricating a solar module that includes the solar cells 101 in accordance with an embodiment of the present invention.

Figure 14:
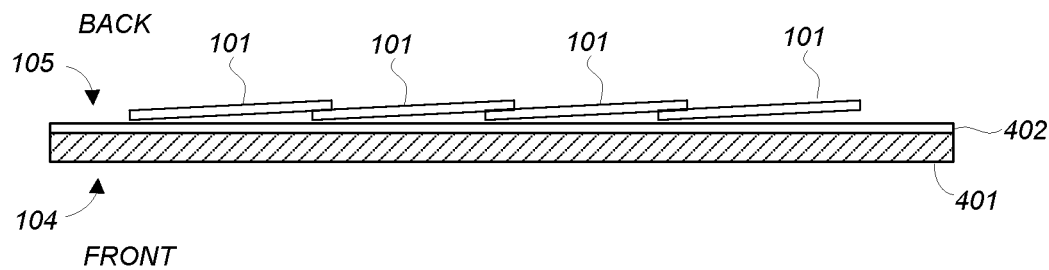
FIGS. 14-17 show cross-sectional views that illustrate a method of fabricating a solar module in accordance with an embodiment of the present invention.

Referring first to FIG. 14, a sheet of encapsulant 402 is placed on a transparent layer 401, which in one embodiment comprises glass. The solar cells 101, in turn, are placed on the sheet of encapsulant 402. The solar cells 101 may be overlapped to form a shingled arrangement before being placed between encapsulants. In one embodiment, the front sides (see arrow 104) of the solar cells 101 are facing toward the sheet of encapsulant 402 and the transparent layer 401.

Figure 15:
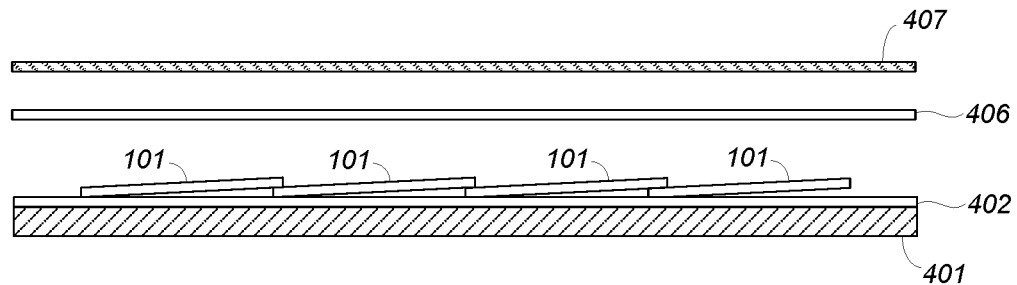

In the example of FIG. 15, a sheet of encapsulant 406 is placed on the back sides of the solar cells 101 and a back layer 407, in turn, is placed on the encapsulant 406. The encapsulants 402 and 406 may comprise silicone, ethylene vinyl acetate (EVA), polyolefin elastomer (POE), or other suitable encapsulant commonly employed in the photovoltaic industry. The encapsulants 402 and 406 are described herein as sheets for illustration purposes. The encapsulants 402 and 406 may also be a liquid encapsulant. The back layer 407 may comprise a backsheet commonly employed in the photovoltaic industry, such as glass or plastic film. The back layer 407 is disposed toward the back sides of the solar cells 101, whereas the transparent layer 401 is disposed toward the front sides of the solar cells 101.

Figure 16:
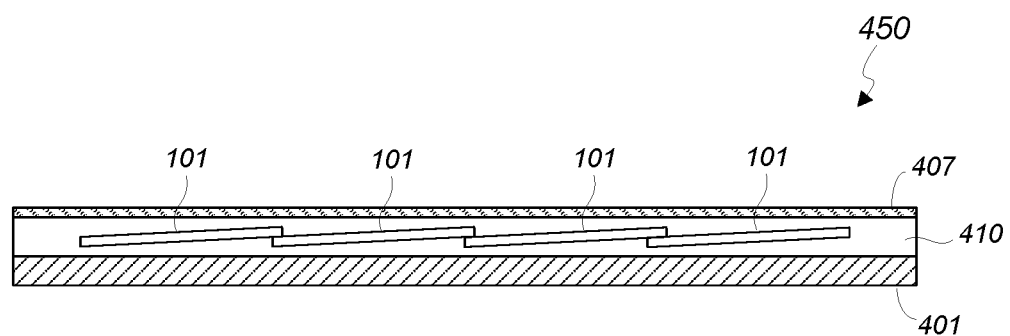
Figure 17:
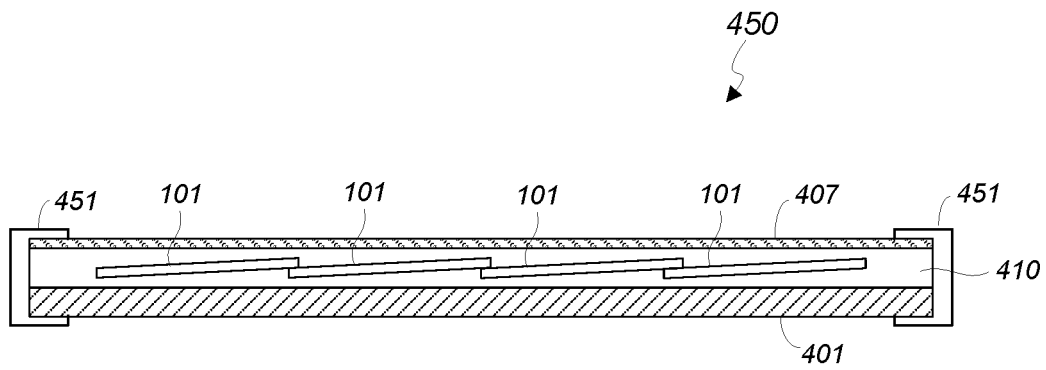

In the example of FIG. 16, the transparent layer 401, the sheet of encapsulant 402, the shingled solar cells 101, the sheet of encapsulant 406, and the back layer 407 are laminated to form a solar module 450. In the example of FIG. 16, the label "410" represents the encapsulants 402 and 406 after lamination. The lamination may be performed by inserting the aforementioned components, as arranged in FIG. 15, in a lamination machine. In the example of FIG. 16, the back layer 407 and the transparent layer 401 are the outermost components of the solar module 450. As shown in the example of FIG. 17, the solar module 450 may include a frame 451 that provides mechanical support to the solar module.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating solar cells, the method comprising:
    using a first laser beam, cutting a groove on a wafer, the groove located between a first solar cell and a second solar cell, the first and second solar cells being adjacent on the wafer;
    depositing a coating powder in the laser cut groove of the wafer;
    using a second laser beam, melting the coating powder in the laser cut groove of the wafer to form a coating layer on a surface of the groove of the wafer; and
    physically separating the first solar cell from the second solar cell along the laser cut groove of the wafer.

2. The method of claim 1, wherein the coating powder has a particle size that is less than 10 μm.

3. The method of claim 1, wherein the coating powder comprises aluminum or boron.

4. The method of claim 1, wherein the coating powder comprises silicon dioxide or boric oxide.

5. The method of claim 1, further comprising:
    loading the wafer into a laser machine that is configured to generate the first laser beam and the second laser beam; and
    after separating the first solar cell from the second solar cell, unloading the wafer from the laser machine.

6. The method of claim 1, wherein physically separating the first solar cell from the second solar cell along the laser cut groove comprises using a third laser beam to physically separate the first solar cell from the second solar cell.

7. The method of claim 1, wherein physically separating the first solar cell from the second solar cell along the laser cut groove comprises using mechanical force to physically separate the first solar cell from the second solar cell.

8. The method of claim 1, wherein the wafer comprises a monocrystalline silicon.

9. A method of fabricating solar cells, the method comprising:
    cutting a groove on a wafer, the groove on the wafer being formed between an existing first solar cell and an existing second solar cell that are already formed on the wafer prior to cutting the groove;
    depositing a coating material in the groove on the wafer;
    melting the coating material in the groove on the wafer to form a coating layer on a surface of the groove on the wafer; and
    physically separating the first solar cell from the second solar cell along the groove on the wafer.

10. The method of claim 9, wherein cutting the groove on the wafer comprises scanning a laser beam on the wafer to form the groove.

11. The method of claim 9, wherein melting the coating material in the groove, the groove having a "V" shape, comprises scanning a laser beam on the coating material in the groove.

12. The method of claim 9, wherein the coating material comprises a coating powder and the method further comprises melting the coating material to form a coating layer on an edge surface of the first solar cell, the coating layer present after separating the first solar cell from the second solar cell along the groove on the wafer, the edge surface extending from a top surface of the first solar cell to a bottom surface of the first solar cell, the coating layer extending from the top surface of the first solar cell to the bottom surface of the first solar cell.

13. The method of claim 12, wherein the coating powder has a particle size that is less than 10 µm.

14. The method of claim 9, wherein the coating material comprises aluminum or boron.

15. The method of claim 9, wherein the coating material comprises silicon dioxide or boric oxide.

16. The method of claim 9, wherein the wafer comprises a monocrystalline silicon.

17. The method of claim 1
wherein the wafer has a top surface and a bottom surface,
wherein the melted coating powder forms a coating layer, and
wherein after physically separating the first solar cell from the second solar cell along the groove of the wafer the coating layer is present on an edge surface extending from the top surface of the wafer to the bottom surface of the wafer.

18. The method of claim 1 wherein an edge of the first solar cell after separation from the second solar cell is coated with melted coating powder, the edge extending from a top surface of the first solar cell to a bottom surface of the first solar cell.

19. The method of claim 1 wherein prior to physically separating the first solar cell from the second solar cell along the groove of the wafer, the method further comprising forming a trench through an emitter layer of the wafer, the trench located between the first solar cell and the second solar cell.

20. The method of claim 9 wherein, after physically separating the first solar cell from the second solar cell along the groove on the wafer, coating material covers an edge of the first solar cell, the edge extending from a light receiving surface of the first solar cell to an opposite back surface of the first solar cell.

* * * * *